(12) United States Patent
Cosgrave

(10) Patent No.: US 7,425,912 B2
(45) Date of Patent: Sep. 16, 2008

(54) DIGITAL-TO-ANALOG CONVERTER WITH CONTROLLED BUFFERED INPUTS

(75) Inventor: Gavin Cosgrave, Enniscorthy (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/474,175

(22) Filed: Jun. 23, 2006

(65) Prior Publication Data

US 2007/0296619 A1 Dec. 27, 2007

(51) Int. Cl.
H03M 1/68 (2006.01)
(52) U.S. Cl. .................................. 341/145; 341/144
(58) Field of Classification Search ........... 341/144, 341/145, 154
See application file for complete search history.

(56) References Cited

U.S. PATENT DOCUMENTS

| | | | |
|---|---|---|---|
| 4,491,825 A | | 1/1985 | Tuthill |
| 4,543,560 A * | | 9/1985 | Holloway ............ 341/144 |
| 4,891,533 A * | | 1/1990 | Holloway ............ 327/566 |
| 5,969,657 A | | 10/1999 | Dempsey et al. |
| 6,150,971 A * | | 11/2000 | Naylor et al. ........... 341/144 |
| 6,724,336 B2 * | | 4/2004 | Leung et al. ............ 341/145 |
| 7,015,847 B1 | | 3/2006 | McLachlan et al. |
| 2005/0035821 A1 | | 2/2005 | Everton et al. |

OTHER PUBLICATIONS

PCT/EP2007/056253, International Search Report, Oct. 11, 2007.
Karthikeyan, S. et al, "Low-Voltage Analog Circuit Design Based On Biased Inverting Opamp Configuration"; IEEE, vol. 47, Mar. 3, 2000, pp. 176-184.

* cited by examiner

*Primary Examiner*—Howard Williams
(74) *Attorney, Agent, or Firm*—Wolf, Greenfield & Sacks, P.C.

(57) ABSTRACT

A DAC circuit is provided which implements a buffered DAC input where the buffer is provided by a differential amplifier whose supply rail is correlated with the input to the DAC. In this way it is possible to buffer the circuitry using amplifiers whose open loop gain specifications may be relaxed without affecting the linearity performance of the DAC.

20 Claims, 3 Drawing Sheets

DIGITAL-TO-ANALOG CONVERTER WITH CONTROLLED BUFFERED INPUTS

FIELD OF THE INVENTION

The present invention relates to a digital to analog converter (DAC) and in particular to a DAC which is provided with buffered inputs.

BACKGROUND

Digital to analog converters or DACs are well known in the art for providing an interface between the digital and the analog realm. The DAC functions by converting a digital, usually binary, input code to a corresponding analog signal, typically voltage or current. They may be implemented in a variety of fashions such as for example using simple switches or a network of resistors, capacitors or current sources. Examples of known DAC arrangements include the following U.S. Pat. Nos. 7,015,847, 5,969,657 and 4,491,825 all of which are co-assigned to the assignee of the present invention.

In a segmented DAC architecture it is sometimes useful to provide a buffer between the output of a first DAC and the input of a second DAC. Such buffers may be provided by amplifiers with high common mode linearity which provide the necessary buffering function yet do not contribute significant integral non linearity (INL) errors at the output of the DAC. While this may provide the necessary buffering function, the use of such amplifiers does suffer in that they often require large compensation capacitors to make the amplifier stable with the result that the implementation is very area intensive.

There is therefore a need to provide a buffer arrangement for the input of a DAC that does not contribute significant INL error to the output of the DAC and yet can be implemented in a fashion that is not area intensive.

SUMMARY

These and other problems are addressed by circuitry provided in accordance with the teachings of the present invention. In accordance with a first embodiment a DAC is provided with buffered inputs, the buffers having supply voltages that are dependent on the input voltage to the buffers. A first embodiment of a circuit in accordance with the teaching of the invention provides a DAC circuit including a first DAC having first and second inputs thereto, the first and second inputs being buffered by first and second buffers respectively and wherein voltage supplies to the first and second buffers are correlated with the inputs to the DAC such that the voltage across the buffers is maintained to a first order fixed thereby reducing non-linearities.

These and other features of the invention will be understood with reference to the following exemplary embodiments.

BRIEF DESCRIPTION OF THE DRAWINGS

The present invention will now be described with reference to the accompanying drawings in which.

DETAILED DESCRIPTION OF THE DRAWINGS

Figure 1:
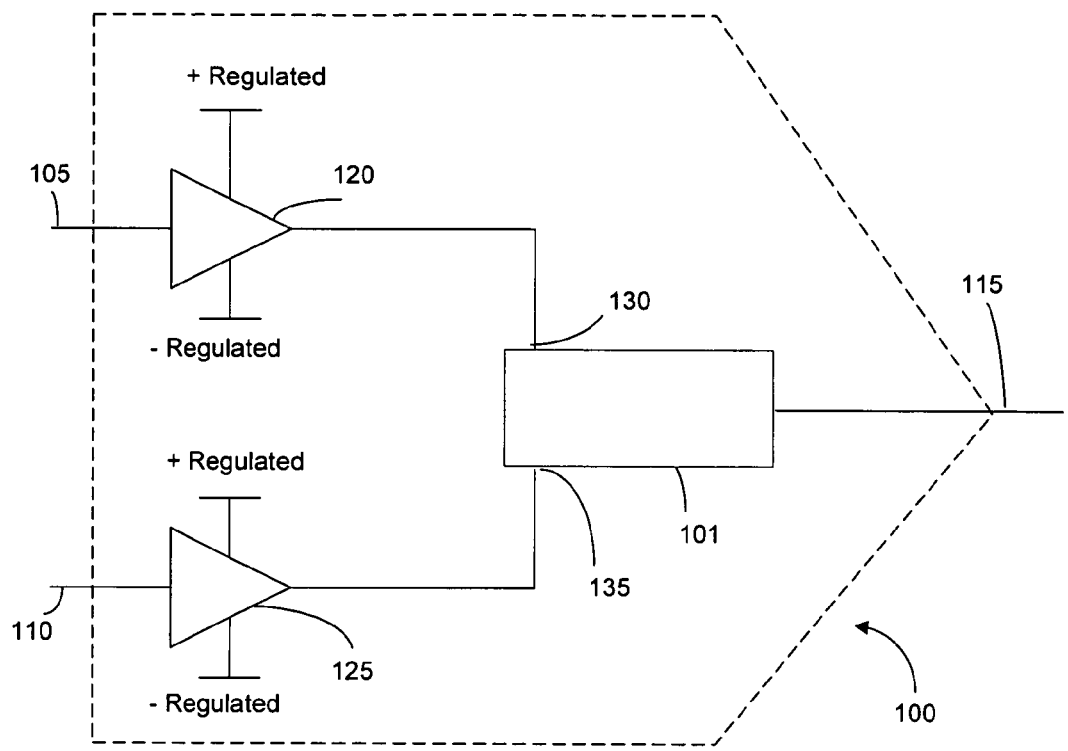
FIG. 1 is a schematic showing a DAC with buffered inputs according to the teaching of the invention

FIG. 1 shows an example of a DAC circuit 100 in accordance with the teaching of the invention. Such a circuit includes first 105 and second 110 inputs. The DAC 100 provides an output 115 which interpolates between said first and second inputs 105, 110. Within the DAC circuit are provided first and second buffers 120, 125 which are coupled to the first and second inputs respectively. The buffers are provided so as to transfer a voltage from a first circuit (not shown), having a high output impedance level, to an interpolation circuit 101, which may be implemented as either an analog or mixed voltage circuit, and which has an input impedance level which is sufficiently low enough to cause non-idealities in the first circuit. Each of the buffers 120, 125 are coupled to a respective input 130, 135 of the interpolation circuit. The interpolation functionality of this DAC 100 is effectively provided by the circuit components of the analog or mixed signal circuit which can be provided by resistors, capacitors and/or transistors (either MOS or bipolar) as will be appreciated by those persons skilled in the art. The interposed buffer, which is provided as a buffer amplifier prevents the analog or mixed signal circuit 101 from loading the first circuit unacceptably and interfering with its desired operation. Such a buffer amplifier may be implemented by configuring an operational amplifier (opamp) in a negative feedback configuration and coupling its positive input to the input signal.

The teaching of the invention provides for the supply voltage of each of the buffer amplifiers to be provided as a regulated supply which is correlated to the input signal to the DAC. The regulation or correlation of the power supply to the buffers requires, as will be appreciated by those skilled in the art, a monitoring of the input signal to the DAC but the power source for those regulated supplies does not necessarily have to be provided on the DAC. It will be understood that amplifier non-linearity can arise from variances in the voltage across the terminals of transistors in the amplifier as the input voltage to the amplifier changes. The properties of a transistor vary non-linearly with the voltage across its terminals and so this change in input voltage can cause a non-linear change in the output voltage. If this was reflected into the DAC, this non-linearity would be evident as integrated non-linearity (INL) at the DAC output, which is not desirable. By providing a regulated supply which is correlated with or bootstrapped to its input voltage, as the input signal changes, the supply voltage to the buffer also changes. In this way the voltage across all devices in the circuit is held constant. It will be understood that such a technique serves to keep the voltage across the transistors in the amplifier fixed, to a first order which significantly reduces the non-linearity of the amplifier due to the non-linearity of the transistors.

It will be understood that, by correlating the amplifier supply voltage with its input voltage, the invention teaches the use of two regulated supplies (a positive power supply and a negative power supply) for a differential amplifier, where the voltage on the regulated supplies is dependent on the input signal to the amplifier. This fixes to a first order the voltage across all the devices in the amplifier. By using a differential amplifier as opposed to a simple source follower arrangement any offset associated with the source follower is eliminated, and the MOS Vth variation does not appear as a non-linearity term in the DAC transfer function.

Figure 2:
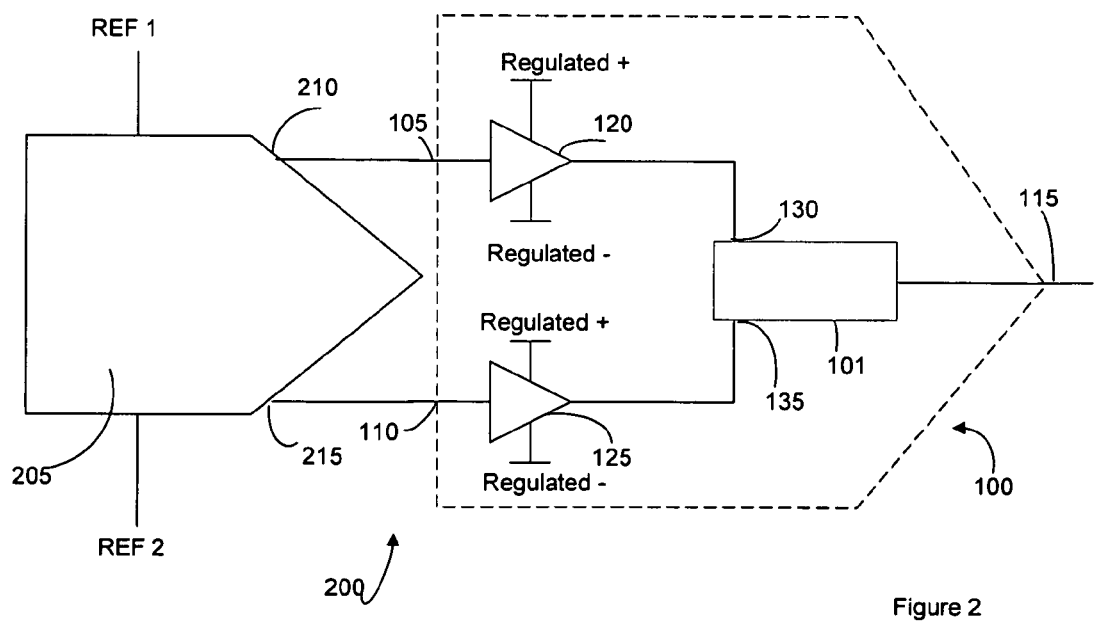
FIG. 2 is a schematic showing portion of a segmented architecture incorporating DAC arrangement according to FIG. 1.

As shown in the configuration of FIG. 2, an embodiment of the invention provides for the DAC 100 of FIG. 1 to be a sub-DAC of a segmented DAC architecture 200. In this segmented architecture, the circuit includes a main DAC 205 whose output 210, 215 is coupled to the sub-DAC. The buffers are provided to buffer the main DAC 205 from the interpolation circuit 101 of the sub-DAC. In such a configuration the supply voltage for the buffer amplifiers may be generated on chip, and is dependent on the input code provided to the main DAC. If implemented in a mixed supply part, it will be appreciated that it may be possible to use a portion of the high voltage that is available to generate the supply voltage for the amplifiers.

In the arrangement of FIG. 2, the main DAC is configured to provide the most significant bit, MSB, and the sub-DAC the least significant bit, LSB of the input word to the DAC architecture. In this way the main DAC will provide a hi and lo signal to the subDAC and the subDAC interpolates between these two signal levels to provide an output. The output signal from the main DAC is also used to control the voltage supplies for the buffer amplifier.

Figure 3:
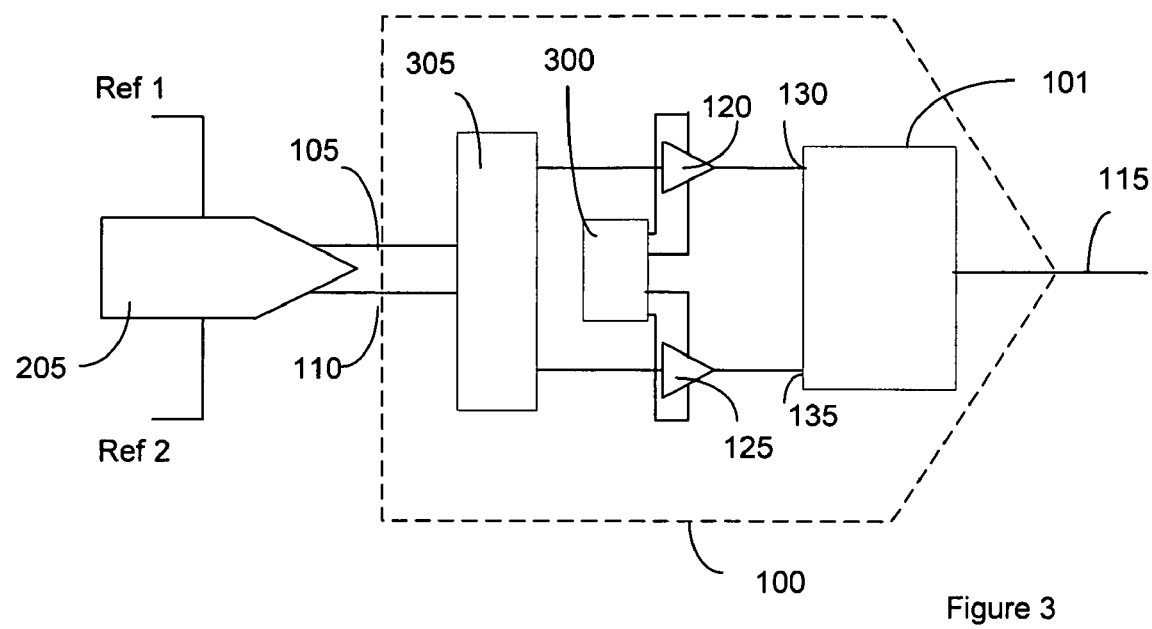
FIG. 3 shows a modification to the architecture of FIG. 2.

As discussed above, the teaching of the invention provides for a correlation of the supply voltages to the buffer amplifiers with the input signal to the DAC. FIG. 3 shows an example of an architecture that may be used to provide such correlation. In this example, the same reference numerals will be used for like parts to that described previously with reference to FIGS. 1 and 2. The DAC 100 of this embodiment includes a power supply circuit component 300 whose output is correlated with the inputs to the DAC. One way of achieving this correlation is to provide a switching circuit 305 which can be used to couple one, both or neither of the inputs 105, 110 to the DAC to the power supply circuit. In this way the output of the power supply circuit will float with the inputs to the DAC. The power supply circuit may be coupled to both buffers 120, 125 so as to provide the supply voltage to each of the buffers. It will be appreciated that the same supply may be provided to each of the buffers, or each may receive an independent supply from the power supply circuit. The interpolation functionality of a DAC in accordance with this embodiment is provided by the circuit components of the analog or mixed signal circuit together with the optional switch network 305.

Figure 4:
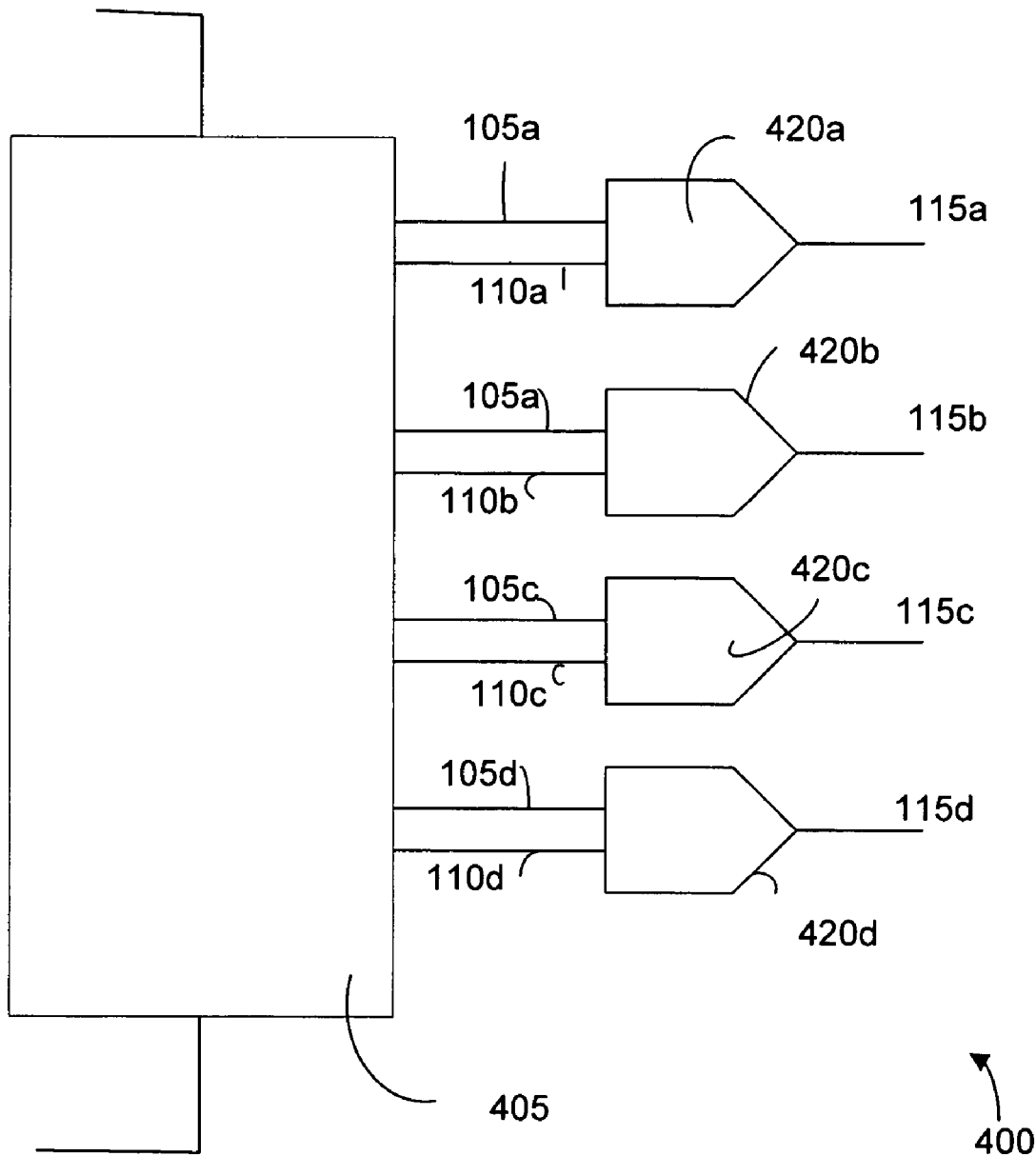
FIG. 4 shows how the architecture of the present invention may be implemented in a multi-channel DAC architecture.

Although described heretofore as an implementation in a single channel DAC architecture, the teaching of the invention may also be implemented in a multi-channel DAC circuit. An example of such a circuit 400 is shown in FIG. 4, where a first stage of the DAC circuit, the main DAC 405, is used as a shared first stage for multiple subDACs 420 (multiple second stages). One or more of the second stages may be implemented in accordance with the teaching of the invention—the use of a buffer amplifier whose supply voltage is correlated with the input to the second stage. There is provided a first stage output for each of the subDACs, and each of the second stage produces an overall output for the DAC channel. With multiple second stages, multiple DAC channels may be provided. An example of such a multi channel circuit is provided in U.S. Pat. No. 7,015,847 co-assigned to the assignee of the present invention, the content of which is incorporated herein by way of reference. It will be understood that in order to provide a buffer between the main DAC and each of the subDACs using the teaching of the prior art where high open loop gain amplifiers were used, that the area requirements would be intensive. Using the teaching of the present invention, such buffering may be used without requiring such high open loop gain amplifiers and therefore it is practical to implement. In such an arrangement the main DAC provides multiple outputs which are switchably coupled to each of the sub-DACs and wherein each of the multiple outputs are coupled to the sub-DAC through buffers.

It will be understood that the invention has been described with reference to exemplary embodiments of a buffered DAC input where the buffer is provided by a differential amplifier whose supply rail is correlated with the input to the DAC. With such an arrangement, the open loop gain specifications of the amplifiers can be relaxed without affecting the linearity performance of the DAC. Whereas the invention has been described with reference to preferred implementations these are provided as exemplary embodiments as numerous modifications can be made and will be apparent to the person skilled in the art. In this way it will be understood that the invention is to be construed in no way limiting except as may be deemed necessary in the light of the appended claims. Modifications can be implemented without departing from the spirit and scope of the invention.

The words comprises/comprising when used in this specification are to specify the presence of stated features, integers, steps or components but does not preclude the presence or addition of one or more other features, integers, steps, components or groups thereof.

The invention claimed is:

1. A DAC circuit including a first DAC having first and second inputs coupled to an interpolation circuit, the interpolation circuit providing an output which interpolates between said first and second inputs, and wherein at least one of the inputs to the interpolation circuit is coupled to a buffer having a supply voltage, the DAC circuit including circuitry configured to monitor at least one of the inputs to the first DAC and to correlate the buffer supply voltage with at least one of the inputs to the first DAC.

2. The DAC circuit as claimed in claim 1 wherein each of the first and second inputs of the DAC are buffered by first and second buffers respectively and wherein the supply voltage to each of the buffers is correlated with the inputs to the first DAC.

3. The DAC circuit as claimed in claim 2 wherein the first DAC is a sub-DAC of a segmented DAC architecture, the circuit including a main DAC whose output is coupled to the sub-DAC and wherein the buffers are provided to buffer components of the main DAC from those of the sub-DAC.

4. The circuit as claimed in claim 3 wherein the main DAC provides multiple outputs which is switchably coupled to the sub-DAC and wherein each of the multiple outputs are coupled to the sub-DAC through the buffer.

5. The circuit as claimed in claim 2 wherein the first and second buffers are provided by first and second amplifiers respectively.

6. The circuit as claimed in claim 5 wherein the first and second amplifier are first and second operational amplifiers, opamps, respectively, the opamps being arranged as unity gain amplifiers.

7. The circuit as claimed in claim 6 wherein the supply voltage for the opamps is a regulated supply, arranged to move in response to changes to the inputs to the amplifiers.

8. The DAC circuit of claim 1 wherein the first DAC is a sub-DAC of a segmented DAC architecture, the circuit including a main DAC whose output is switchably coupled to the sub-DAC.

9. The DAC circuit of claim 8 wherein the output of the main DAC is coupled via a plurality of switches to multiple inputs of the sub-DAC.

10. The DAC circuit of claim 9 wherein each of the multiple inputs of the sub-DAC are buffered from the outputs of the main DAC.

11. The DAC circuit of claim 10 and wherein the buffers are provided between the main DAC and an interpolation circuit of the sub-DAC.

12. The DAC of claim 11 wherein multiple buffers may be coupled to the first input of the sub-DAC and the second input of the sub-DAC is provided in an open switch configuration.

13. The DAC of claim 1 wherein the interpolation circuit is provided in an analog configuration.

14. The circuit as claimed in claim 1 wherein the interpolation circuit is provided in a mixed signal configuration.

15. A digital to analog converter DAC having first and second buffered inputs, and providing an output signal based on an interpolation between the first and second buffered inputs, wherein the DAC further comprises a correlating circuit for monitoring at least one of the inputs to the DAC and correlating the supply voltages to the buffers with at least one of the inputs to the DAC.

16. A method for use in a DAC circuit, the method including:
   a) providing an interpolation circuit configured to provide an output based on an interpolation between two input signals to the interpolation circuit,
   b) buffering at least one of the input signals using operational amplifiers provided in a unity gain configuration,
   c) monitoring at least one of the inputs to the DAC circuit, and
   d) correlating the amplifier supply voltage with at least one of the inputs to the DAC.

17. A method of claim 16 wherein buffering at least one of the input signals comprises buffering each of the two input signals by first and second buffers, respectively, and wherein a supply voltage to each of the buffers is correlated with the input to the DAC.

18. The method of claim 17 wherein the DAC is a sub-DAC of a segmented DAC architecture and further providing a main DAC having an output coupled to the sub-DAC and wherein the buffers are provided are provided to buffer components of the main DAC from those of the sub-DAC.

19. The method of claim 18 wherein the main DAC provides multiple outputs which are switchably coupled to the sub-DAC and wherein each of the multiple outputs is coupled to the sub-DAC through a buffer.

20. The method of claim 16 wherein the DAC is a sub-DAC of a segmented DAC architecture and further including providing a main DAC whose output is switchably coupled to the sub-DAC.

* * * * *